(12) United States Patent
Sandhu et al.

(10) Patent No.: US 7,199,415 B2
(45) Date of Patent: Apr. 3, 2007

(54) CONDUCTIVE CONTAINER STRUCTURES HAVING A DIELECTRIC CAP

(75) Inventors: Gurtej Singh Sandhu, Boise, ID (US); Alan R. Reinberg, Westport, CT (US)

(73) Assignee: Micron Technology, Inc., Boise, ID (US)

(*) Notice: Subject to any disclaimer, the term of this patent is extended or adjusted under 35 U.S.C. 154(b) by 121 days.

(21) Appl. No.: 10/931,408

(22) Filed: Aug. 31, 2004

(65) Prior Publication Data

US 2005/0023588 A1    Feb. 3, 2005

Related U.S. Application Data

(62) Division of application No. 09/945,497, filed on Aug. 30, 2001, now Pat. No. 6,833,579, which is a division of application No. 09/258,565, filed on Feb. 26, 1999, now Pat. No. 6,303,956.

(51) Int. Cl.
*H01L 27/108* (2006.01)
*H01L 29/76* (2006.01)
*H01L 29/94* (2006.01)
*H01L 31/119* (2006.01)
*H01L 29/00* (2006.01)

(52) U.S. Cl. .................. 257/301; 257/68; 257/71; 257/277; 257/296; 257/297; 257/298; 257/299; 257/300; 257/302; 257/303; 257/304; 257/305; 257/306; 257/307; 257/308; 257/309; 257/310; 257/311; 257/312; 257/313; 257/532; 257/533; 257/534; 257/535; 257/758; 257/759; 257/760; 257/906

(58) Field of Classification Search ............ 257/68, 257/71, 277, 906, 296–313, 532–535, 758–760
See application file for complete search history.

(56) References Cited

U.S. PATENT DOCUMENTS

| | | | |
|---|---|---|---|
| 4,093,503 A | 6/1978 | Harris et al. | 156/628 |
| 4,571,817 A | 2/1986 | Birritella et al. | 29/576 B |
| 4,725,560 A | 2/1988 | Abernathey et al. | 437/20 |
| 4,783,309 A | 11/1988 | Popp et al. | 376/272 |
| 4,847,214 A | 7/1989 | Robb et al. | 437/67 |
| 4,848,566 A | 7/1989 | Havens et al. | 206/328 |
| 5,043,780 A | 8/1991 | Fazan et al. | 357/23.6 |
| 5,061,650 A | 10/1991 | Dennison et al. | 437/47 |
| 5,068,199 A | 11/1991 | Sandhu | 437/52 |
| 5,130,885 A | 7/1992 | Fazan et al. | 361/313 |
| 5,138,412 A | 8/1992 | Hieda et al. | 357/23.6 |
| 5,185,282 A | 2/1993 | Lee et al. | 437/47 |
| 5,191,509 A | 3/1993 | Wen | 361/311 |

(Continued)

OTHER PUBLICATIONS

*Office Action mailed by the US PTO on Apr. 23, 2003 for related matter U.S. Appl. No. 09/945,397*, Office Action mailed by the US PTO on Apr. 23, 2003 for related matter U.S. Appl. No. 09/945,397.

Kuhn, G , et al., "Thin Silicon Film on Insulating Substrate", *Journal of the Electrochemical Society*, 120(11), (1973),pp. 1563-1566.

(Continued)

*Primary Examiner*—Ida M. Soward
(74) *Attorney, Agent, or Firm*—Schwegman, Lundberg, Woessner & Kluth, P.A.

(57) ABSTRACT

Container structures for use in integrated circuits and methods of their manufacture. The container structures have a dielectric cap on the top of a conductive container to reduce the risk of container-to-container shorting by insulating against bridging of conductive debris across the tops of adjacent container structures. The container structures are adapted for use in memory cells and apparatus incorporating such memory cells, as well as other integrated circuits.

16 Claims, 8 Drawing Sheets

U.S. PATENT DOCUMENTS

| | | | | |
|---|---|---|---|---|
| 5,192,702 A | 3/1993 | Tseng | | 437/47 |
| 5,206,183 A | 4/1993 | Dennison | | 437/47 |
| 5,244,842 A | 9/1993 | Cathey et al. | | 437/228 |
| 5,266,514 A | 11/1993 | Tuan et al. | | 437/52 |
| 5,278,091 A | 1/1994 | Fazan et al. | | 437/52 |
| 5,284,787 A | 2/1994 | Ahn | | 437/52 |
| 5,290,729 A | 3/1994 | Hayashide et al. | | 437/60 |
| 5,340,765 A | 8/1994 | Dennison et al. | | 437/52 |
| 5,358,908 A | 10/1994 | Reinberg et al. | | 437/228 |
| 5,364,817 A | 11/1994 | Lur et al. | | 437/192 |
| 5,366,917 A | 11/1994 | Watanabe et al. | | 437/47 |
| 5,381,302 A | 1/1995 | Sandhu et al. | | 361/305 |
| 5,384,152 A | 1/1995 | Chu et al. | | 427/81 |
| 5,392,189 A | 2/1995 | Fazan et al. | | 361/305 |
| 5,405,801 A | 4/1995 | Han et al. | | 437/60 |
| 5,407,534 A | 4/1995 | Thakur | | 156/662 |
| 5,418,180 A | 5/1995 | Brown | | 437/60 |
| 5,422,294 A | 6/1995 | Noble, Jr. | | 437/52 |
| 5,444,013 A | 8/1995 | Akram et al. | | 437/60 |
| 5,447,878 A | 9/1995 | Park et al. | | 437/52 |
| 5,451,537 A | 9/1995 | Tseng et al. | | 437/52 |
| 5,459,094 A | 10/1995 | Jun | | 437/52 |
| 5,459,344 A | 10/1995 | Wakamiya et al. | | 257/307 |
| 5,478,772 A | 12/1995 | Fazan | | 437/60 |
| 5,480,826 A | 1/1996 | Sugahara et al. | | 437/52 |
| 5,481,127 A | 1/1996 | Ogawa | | 257/308 |
| 5,484,740 A | 1/1996 | Cho | | 437/40 |
| 5,494,841 A | 2/1996 | Dennison et al. | | 437/52 |
| 5,498,562 A | 3/1996 | Dennison et al. | | 437/52 |
| 5,506,166 A | 4/1996 | Sandhu et al. | | 437/60 |
| 5,543,345 A | 8/1996 | Liaw et al. | | 437/52 |
| 5,554,557 A | 9/1996 | Koh | | 437/52 |
| 5,597,756 A | 1/1997 | Fazan et al. | | 437/52 |
| 5,604,147 A * | 2/1997 | Fischer et al. | | 438/455 |
| 5,608,247 A | 3/1997 | Brown | | 257/306 |
| 5,629,223 A | 5/1997 | Thakur | | 438/398 |
| 5,634,974 A | 6/1997 | Weimer et al. | | 117/103 |
| 5,639,689 A | 6/1997 | Woo | | 437/193 |
| 5,650,351 A | 7/1997 | Wu | | 437/52 |
| 5,658,381 A | 8/1997 | Thakur et al. | | 257/309 |
| 5,663,090 A | 9/1997 | Dennison et al. | | 438/398 |
| 5,754,390 A | 5/1998 | Sandhu et al. | | 361/321.4 |
| 5,759,262 A | 6/1998 | Weimer et al. | | 117/88 |
| 5,770,500 A | 6/1998 | Batra et al. | | 438/255 |
| 5,773,341 A | 6/1998 | Green et al. | | 438/253 |
| 5,792,689 A | 8/1998 | Yang | | 438/253 |
| 5,795,805 A | 8/1998 | Wu et al. | | 438/253 |
| 5,801,413 A | 9/1998 | Pan | | 257/301 |
| 5,817,555 A | 10/1998 | Cho | | 438/253 |
| 5,859,760 A | 1/1999 | Park et al. | | 361/313 |
| 5,888,877 A | 3/1999 | Dennison et al. | | 438/386 |
| 5,892,256 A * | 4/1999 | Matsushita et al. | | 257/301 |
| 5,909,044 A * | 6/1999 | Chakravarti et al. | | 257/301 |
| 5,937,294 A | 8/1999 | Sandhu et al. | | 438/255 |
| 5,940,713 A | 8/1999 | Green | | 438/396 |
| 5,963,804 A | 10/1999 | Figura et al. | | 438/255 |
| 6,008,513 A * | 12/1999 | Chen | | 257/296 |
| 6,018,172 A | 1/2000 | Hidaka et al. | | 257/296 |
| 6,025,246 A | 2/2000 | Kim | | 438/396 |
| 6,027,970 A | 2/2000 | Sharan et al. | | 438/255 |
| 6,046,083 A | 4/2000 | Lin et al. | | 438/255 |
| 6,077,743 A | 6/2000 | Chen | | 438/255 |
| 6,124,607 A | 9/2000 | Sandhu | | 257/309 |
| 6,140,201 A | 10/2000 | Jenq et al. | | 438/396 |
| 6,144,054 A * | 11/2000 | Agahi et al. | | 257/296 |
| 6,146,967 A | 11/2000 | Thakur et al. | | 438/398 |
| 6,150,691 A | 11/2000 | Clampitt | | 257/308 |
| 6,177,310 B1 | 1/2001 | Lin et al. | | 438/255 |
| 6,177,340 B1 | 1/2001 | Yoo et al. | | 438/637 |
| 6,204,527 B1 * | 3/2001 | Sudo et al. | | 257/301 |
| 6,207,523 B1 | 3/2001 | Parekh et al. | | 438/396 |
| 6,218,237 B1 | 4/2001 | Sandhu et al. | | 438/253 |
| 6,218,288 B1 | 4/2001 | Li et al. | | 438/627 |
| 6,235,639 B1 | 5/2001 | Sandhu et al. | | 438/705 |
| 6,255,687 B1 | 7/2001 | Figura et al. | | 257/309 |
| 6,258,691 B1 | 7/2001 | Kim | | 438/398 |
| 6,281,072 B1 | 8/2001 | Li et al. | | 438/253 |
| 6,303,956 B1 * | 10/2001 | Sandhu et al. | | 257/306 |
| 6,404,005 B1 * | 6/2002 | DeBoer et al. | | 257/309 |
| 6,440,795 B1 * | 8/2002 | Harshfield | | 438/255 |
| 6,596,577 B2 * | 7/2003 | Hermes | | 438/241 |
| 6,858,535 B2 * | 2/2005 | Marsh | | 438/667 |
| 6,946,357 B2 * | 9/2005 | Sandhu et al. | | 438/386 |
| 2003/0126356 A1 | 7/2003 | Gustavson et al. | | 711/105 |
| 2004/0070018 A1* | 4/2004 | Keeth et al. | | 257/300 |
| 2004/0125538 A1* | 7/2004 | Carstensen | | 361/305 |

OTHER PUBLICATIONS

Mine, T., et al., "Capacitance-Enhanced Stacked-Capacitor with Engraved Storage Electrode for Deep Submicron DRAMs", *Extended Abstracts of the 21st Conference on Solid State Decives and Materials*, Tokyo,(1989),pp. 137-140.

Schnakenberg, U, et al., "TMAHW Etchants for Silicon Micromachining", *Transducers—International Conference on Solid-State Sensors and Actuators—Digest of Technical Papers*, (1991),pp. 815-818.

Watanabe, H., et al., "Hemispherical Grain Silicon for High Density DRAMs", *Solid State Technology*, (Jul. 1992),pp. 29-33.

* cited by examiner

CONDUCTIVE CONTAINER STRUCTURES HAVING A DIELECTRIC CAP

RELATED APPLICATIONS

This application is a divisional of U.S. application Ser. No. 09/945,497 filed Aug. 30, 2001 now issued as U.S. Pat. No. 6,833,579, which is a divisional of U.S. application Ser. No. 09/258,565 filed Feb. 26, 1999 now issued as U.S. Pat. No. 6,303,956. These applications are incorporated herein by reference.

TECHNICAL FIELD

The present invention relates generally to development of capped container structures, and in particular to development of semiconductor container capacitor structures having a dielectric cap, and apparatus making use of such container capacitor structures.

BACKGROUND

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. The top plate of each capacitor is typically shared, or common, with each of the other capacitors. This plate is referred to as the "cell plate," The charge stored across the capacitor is representative of a data bit and can be either a high voltage or a low voltage.

Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell has two digit lines, digit and digit complement.

Typically, the memory cells are arranged in an array and each cell has an address identifying its location in the array. The array includes a configuration of intersecting conductive lines and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation the selected word line activates the access transistors for a given word line address, and data is latched to the digit line pairs.

As DRAMs increase in memory cell density, there is a continuing challenge to maintain sufficiently high storage capacitance despite decreasing memory cell area and its accompanying capacitor area, since capacitance is a function of plate area. Additionally, there is a continuing goal to further decrease memory cell area.

A principal way of increasing cell capacitance is through cell structure techniques. Such techniques include three-dimensional cell capacitors, such as trenched or stacked capacitors. One common form of stacked capacitor structure is a cylindrical container stacked capacitor, with a container structure forming the bottom plate of the capacitor.

Another method of increasing cell capacitance is through the use of high surface area materials such as hemispherical grain polysilicon (HSG) which increase available surface area for a given foot print due to their roughened or irregular surfaces.

As cell area decreases, container structures must be formed in closer proximity to neighboring container structures. At close proximity, a danger exists that conductive fragments will rest on the tops of the container structures, bridging between neighboring container structures and thus acting as a short circuit. Such conductive fragments may be pieces of a container dislodged or broken off during cell formation. Fragments from HSG container structures are often referred to as "grapes" or "floaters." Capacitors produced from such shorted container structures will result in defective memory cells, as the cells will be unable to accurately store data.

For the reasons stated above, and for other reasons stated below which will become apparent to those skilled in the art upon reading and understanding the present specification, there is a need in the art for an improved container structure and methods of producing same.

SUMMARY

One embodiment of the invention provides a semiconductor structure. The semiconductor structure includes a conductive container structure having a closed bottom and sidewalls extending upward from the closed bottom. The semiconductor container structure further includes a dielectric cap on top of the sidewalls. In another embodiment, the conductive container structure has a cylindrical shape. In a further embodiment, the conductive container structure is formed using amorphous silicon, polysilicon or hemispherical grain polysilicon, either singly or in combination. In a still further embodiment, the silicon material is conductively doped. In one embodiment, the dielectric cap is formed of oxide, nitride or silicon oxynitride. In another embodiment, the dielectric cap is annealed.

Another embodiment of the invention provides a method of forming a semiconductor structure. The method includes forming an insulating layer on a substrate and forming an opening in the insulating layer, wherein the opening has a bottom on an exposed portion of the substrate and sidewalls defined by the insulating layer. The method further includes forming a conductive layer on the insulating layer and the exposed portion of the substrate, forming a fill layer on the conductive layer, wherein the fill layer fills the opening, and removing the conductive layer and the fill layer to a level below a top of the insulating layer, thereby forming a container structure having sidewalls comprised of the conductive layer on the sidewalls of the opening, and a closed bottom comprised of the conductive layer on the bottom of the opening. The method still further includes forming a dielectric cap on a top of the sidewalls of the conductive layer, removing the fill layer to expose an inside of the container structure, and removing at least a portion of the insulating layer to expose an outside of the container structure. In one embodiment, the dielectric cap is formed by forming a dielectric layer on the insulating layer, the conductive layer and the fill layer, and removing the dielectric layer from the insulating layer and the fill layer.

A further embodiment of the invention provides a method of forming a semiconductor structure. The method includes forming an insulating layer on a substrate and forming an opening in the insulating layer, wherein the opening has a bottom on an exposed portion of the substrate and sidewalls defined by the insulating layer. The method further includes forming a conductive layer on the insulating layer and the exposed portion of the substrate, forming a fill layer on the conductive layer, wherein the fill layer fills the opening, removing the fill layer to a level substantially even with a top of the insulating layer, and removing the conductive layer to a level below the level below the top of the insulating layer, thereby forming a container structure having sidewalls comprised of the conductive layer on the sidewalls of the opening, and a closed bottom comprised of the conductive layer on the bottom of the opening. The method still further includes forming a dielectric cap on a top of the sidewalls of the conductive layer, removing the fill layer to expose an inside of the container structure, and removing at least a portion of the insulating layer to expose an outside of the container structure.

Further embodiments of the invention include semiconductor structures and methods of varying scope, as well as apparatus, devices, modules and systems making use of such semiconductor structures and methods.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Container Structures

Figure 1:
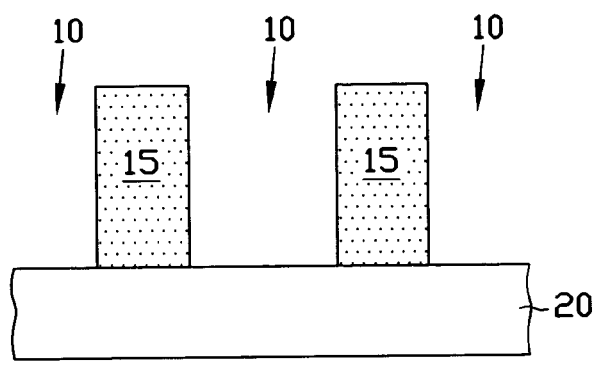
FIGS. 1–8 are cross sectional views of a substrate during various stages of forming a container structure in accordance with an embodiment of the invention.

In FIG. 1, after preparing an insulating layer 15 on the surface of a substrate 20 using conventional processing, one or more openings 10 are formed in the insulating layer 15, exposing a portion of the substrate 20. Opening 10 has a bottom defined by the exposed portion of the substrate 20 and sidewalls defined by the surrounding insulating layer 15.

Openings 10 are generally formed over active areas of the substrate 20 when forming a container structure for a capacitor in an integrated circuit. The processing for forming insulating layer 15 on the surface of substrate 20, as well as the processing for forming openings 10 in insulating layer 15, are not detailed herein as such methods are well known to those of ordinary skill in the art.

Figure 2:
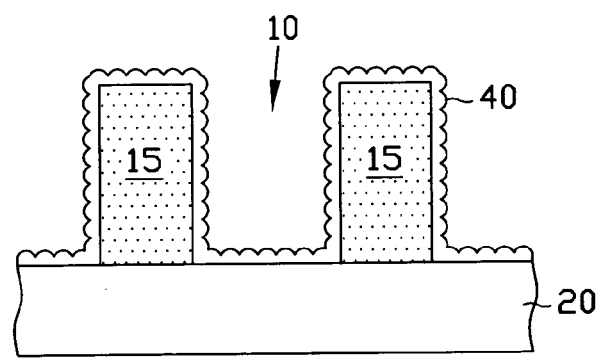

A container layer 40 having conductive material is then deposited on substrate 20 and insulating layer 15 in FIG. 2, thus forming a conductive layer. Container layer 40 is preferably hemispherical grain polysilicon (HSG) when used as a bottom plate of a capacitor, conductively-doped for conductivity. Container layer 40 may further include other materials, such as amorphous silicon and polysilicon either singly or in combination. Similarly, insulating layer 15 is preferably borophosphosilicate glass (BPSG) when container layer 40 is used as a bottom plate of a capacitor, but insulating layer 15 may include other insulative materials, such as oxides or nitrides.

Figure 3:
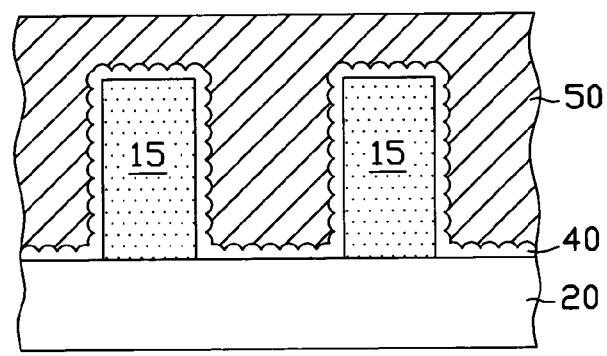

Following deposition of container layer 40, fill layer 50 is deposited on container layer 40 in FIG. 3. Fill layer 50 fills openings 10 to protect them during subsequent processing. Fill layer 50 is preferably a photoresist material for processing ease and convenience, but may be other removable materials, e.g., high etch rate oxides such as TEOS (tetraethyl orthosilicate).

Figure 4:
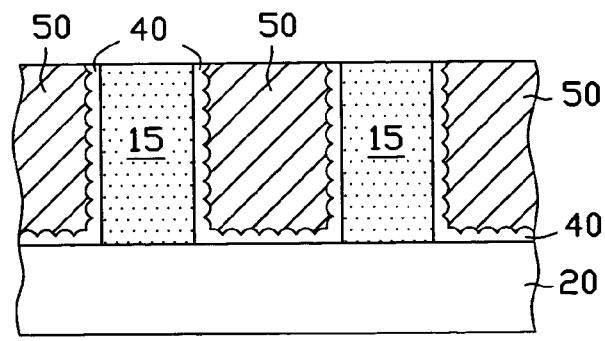
Figure 5:
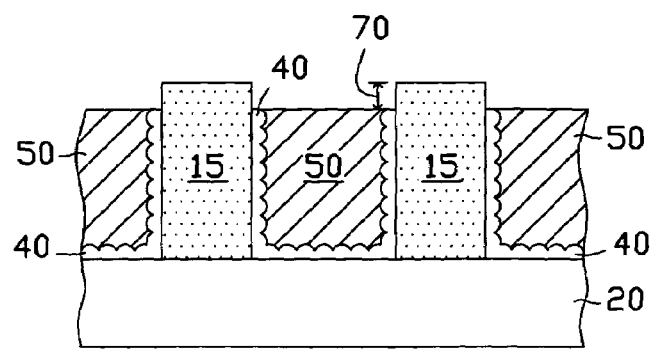

Fill layer 50 and container layer 40 are then removed to approximately the top of insulating layer 15 in FIG. 4. Fill layer 50 and container layer 40 are preferably planarized by chemical mechanical polishing (CMP) or removed by blanket etch-back. At this stage, a container structure is defined by a portion of container layer 40 formed on the sidewalls of the opening, and a closed bottom defined by a portion of container layer 40 formed on the bottom of the opening. Through continued removal, fill layer 50 and container layer 40 are then recessed to just below the surface of insulating layer 15 in FIG. 5. Such removal may be accomplished through CMP with chemistry more selective to fill layer 50 and container layer 40 than insulating layer 15, or by an etch-back process.

Figure 6:
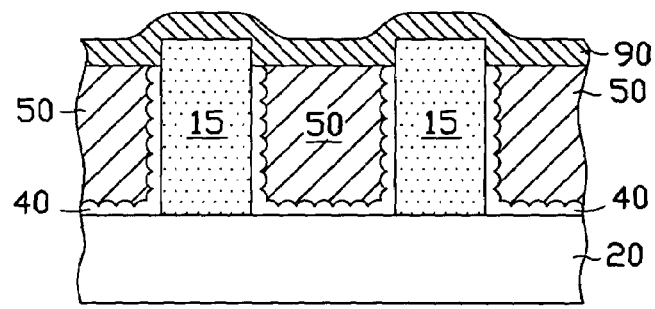

In FIG. 6, a first dielectric layer 90 is deposited on insulating layer 15, container layer 40 and fill layer 50. First dielectric layer 90 is preferably a plasma-deposited silicon oxynitride ($SiO_xN_y$) when container layer 40 is used as a bottom plate of a capacitor. Alternatively, first dielectric layer 90 may be other insulating materials having a high resistance to etchants used to subsequently remove insulating layer 15. First dielectric layer 90 should preferably be suitable for low-temperature deposition when fill layer 50 is a photoresist material, but need not be if fill layer 50 is capable of withstanding higher temperatures.

Figure 7:
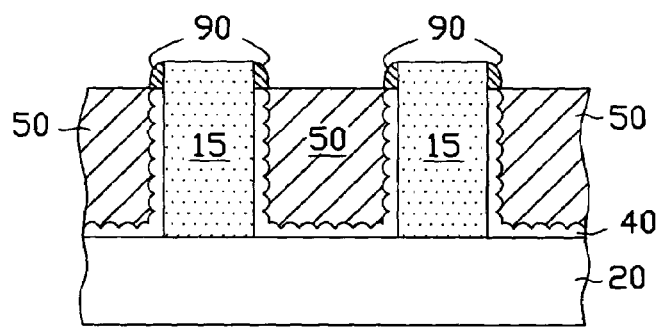

In FIG. 7, using an anisotropic etch process, such as a plasma etch, the horizontal portions of first dielectric layer 90 are removed. Anisotropic etch processes generally remove material at a faster rate measured perpendicular to the substrate surface than parallel to the substrate surface. As such, the vertical portions of first dielectric layer 90 will remain after the horizontal portions are removed, due to their relative depths in the direction perpendicular to the substrate surface. This is similar to gate spacer formation which is well understood in the art.

Figure 8:
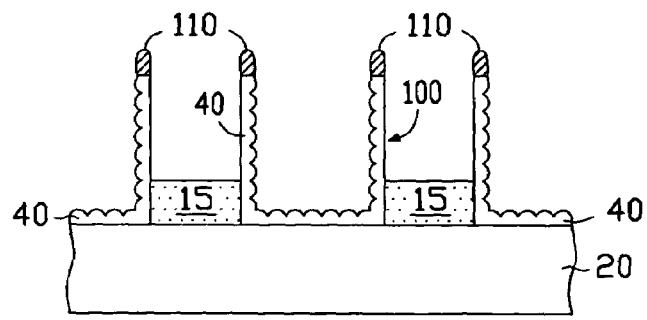

In FIG. 8, at least a portion of insulating layer 15 is then removed to expose the remaining first dielectric layer 90, thus defining dielectric cap 110, and to expose at least a portion of the outside of the sidewalls of container layer 40. In addition, fill layer 50 is removed to expose the inside of the sidewalls of container layer 40. Insulating layer 15 may be removed in its entirety, but removal is commonly halted before the substrate is exposed.

Dielectric cap 110 is on the top of the sidewalls of container structure 100, i.e., the vertical portions of container layer 40 as depicted in FIG. 8. When silicon oxynitride is used for first dielectric layer 90, it is preferably annealed prior to removal of portions of insulating layer 15. Annealing the silicon oxynitride makes it more resistant to etchants that may be used to remove insulating layer 15. Preferably, first dielectric layer is annealed at approximately 600° C. to 1000° C. for approximately 10 to 20 seconds.

Because dielectric cap 110 is formed prior to the removal of surrounding insulating layer 15 or fill layer 50 to expose the sidewalls of container structure 100, dielectric cap 110 serves to protect the top of container structure 100 from container-to-container bridging of conductive debris prior to formation of any dielectric or other insulating material blanketing container structure 100. Container structures 100 are most vulnerable to such container-to-container shorts after exposing the sidewalls. Thus, formation of the dielectric cap 110 before exposing the sidewalls of container structure 100 provides protection for container structure 100 that is not provided by blanket insulation after exposing the sidewalls.

Figure 9:
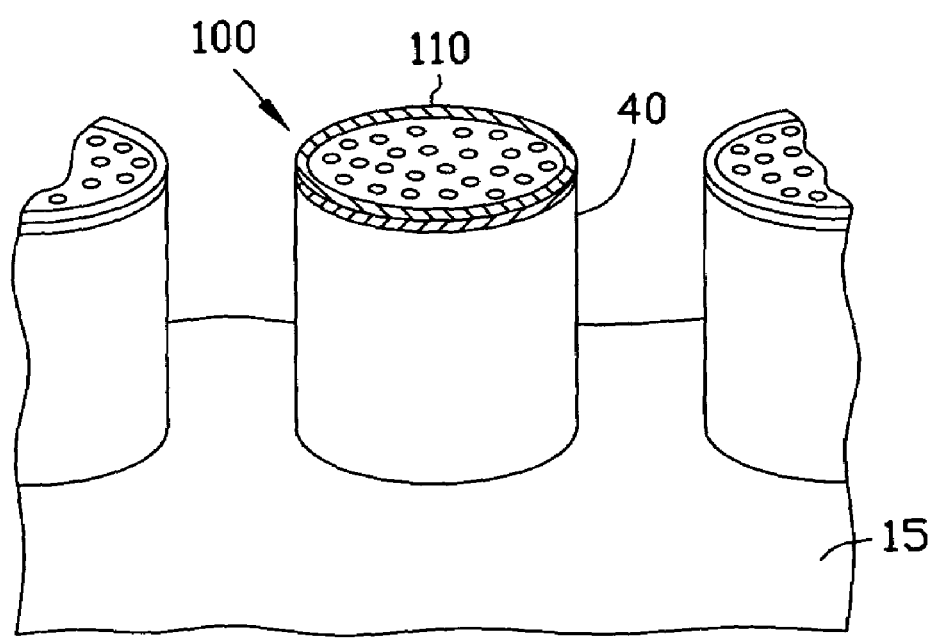
FIG. 9 is a perspective view of a container structure in accordance with an embodiment of the invention.

To better illustrate the relationship between dielectric cap 110 and container layer 40, FIG. 9 depicts a perspective view of the resulting container structure 100. To form a stacked capacitor from resulting container structure 100, a second dielectric layer (not shown) would be formed over container structure 100 and a cell plate (not shown) would be formed over the second dielectric layer.

While container structure 100 is depicted as a cylindrical container, container structures of the type described herein need not be cylindrical, and are often oval or irregular in shape. Furthermore, the sidewalls of such container structures need not be vertical, but may be faceted or otherwise sloped. Generally, however, appropriate container structures include a closed bottom, and sidewalls extending upward from the closed bottom.

Figure 10:
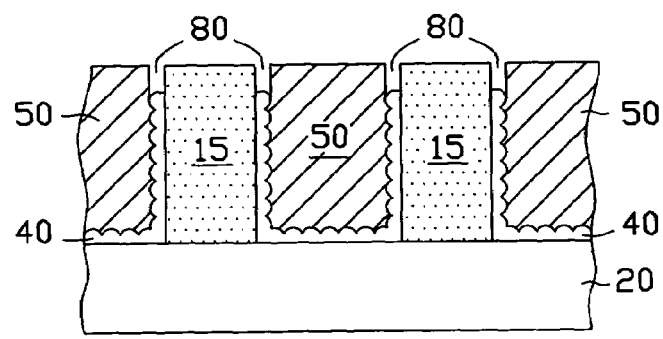
FIGS. 10–12 are cross sectional views of a substrate during various stages of forming a container structure in accordance with an alternate embodiment of the invention.

In an alternative embodiment, processing of the container structure 100 proceeds as in the previous embodiment through that depicted in FIG. 4, where container layer 40 and fill layer 50 are removed to the surface of insulating layer 15. As shown in FIG. 10, container layer 40 is then recessed below the surface of insulating layer 15 using a selective etch process. When container layer 40 contains polysilicon, a timed, wet poly etch process can be used to recess container layer 40. The wet poly etch may remove portions of fill layer 50, but will generally be selective to the polysilicon such that container layer 40 will be recessed below both insulating layer 15 and fill layer 50.

Figure 11:
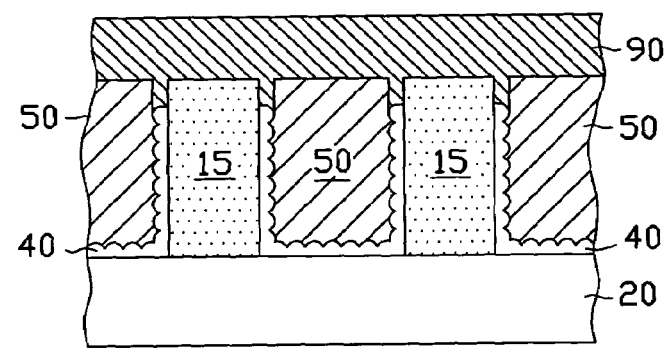
Figure 12:
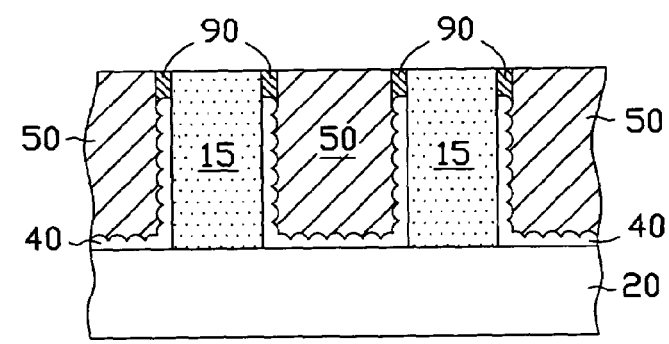

A first dielectric layer 90 is deposited over insulating layer 15, container layer 40 and fill layer 50 in FIG. 11. First dielectric layer 90 is then removed to the surface of insulating layer 15 in FIG. 12 by suitable means, preferably CMP. Subsequent removal of fill layer 50 and portions of insulating layer 15, such as by selective etching, results in substantially the same container structure 100 as shown in FIG. 8.

Memory Cells

Figure 13:
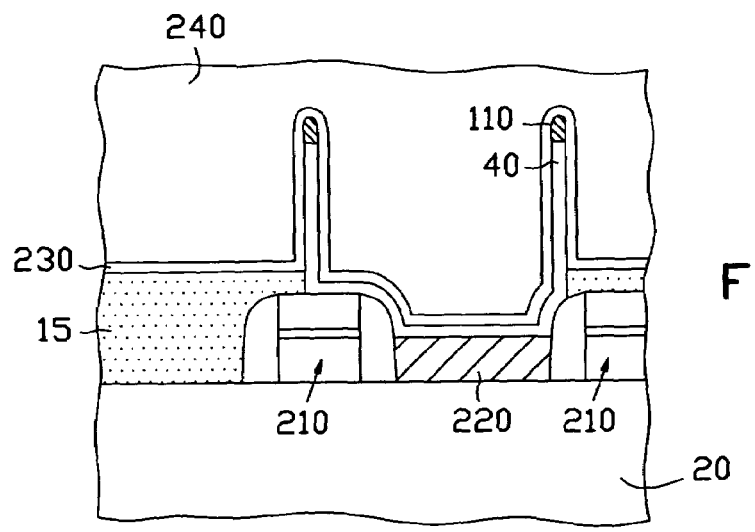
FIG. 13 is a cross sectional view of a memory cell container capacitor in accordance with an embodiment of the invention.

FIG. 13 depicts one embodiment of a container structure as used in a container capacitor for a memory cell. The container structure is formed over a contact 220 to an active area of substrate 20. Container layer 40 is formed between adjacent word lines 210, having structures well understood in the art, and acts as the bottom plate of the container capacitor.

Container layer 40 is capped with dielectric cap 110 in accordance with an embodiment of the invention. The container structure is covered by a second dielectric layer 230. Second dielectric layer 230 is an insulative material. Second dielectric layer 230 is further covered by cell plate 240. Cell plate 240 is preferably conductively-doped polysilicon. Such memory cells are suitable for use in memory devices.

Memory Devices

Figure 14:
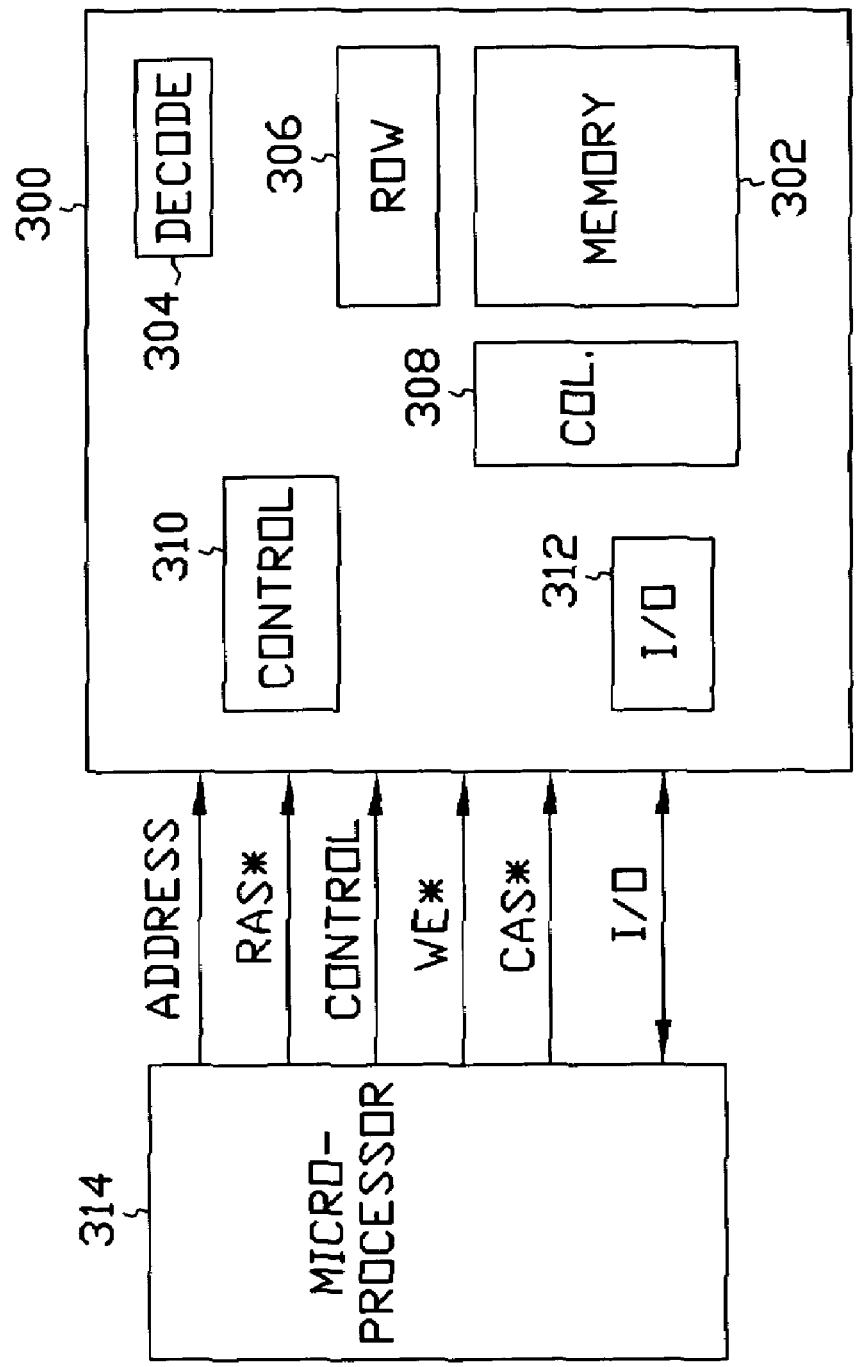
FIG. 14 is a block diagram of an integrated circuit memory device in accordance with an embodiment of the invention.

FIG. 14 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 14 has been simplified to help focus on the invention. At least one of the memory cells has a container capacitor of the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 15:
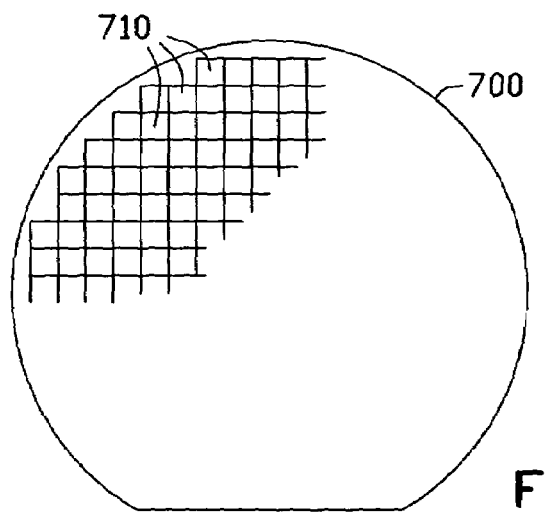
FIG. 15 is an elevation view of a wafer containing semiconductor dies in accordance with an embodiment of the invention.

With reference to FIG. 15, in one embodiment, a semiconductor die 710 is produced from a silicon wafer 700. A die is an individual pattern, typically rectangular, on a substrate that contains circuitry, or integrated circuit devices, to perform a specific function. At least one of the integrated circuit devices is a container capacitor as disclosed herein. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 16:
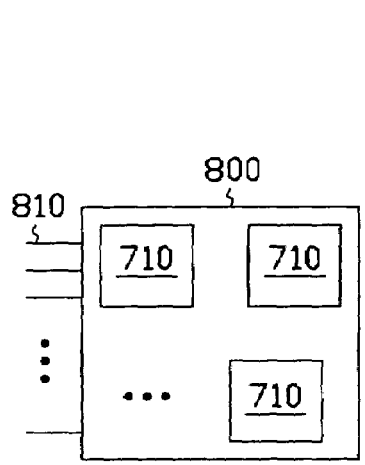
FIG. 16 is a block diagram of an exemplary circuit module in accordance with an embodiment of the invention.

As shown in FIG. 16, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 17:
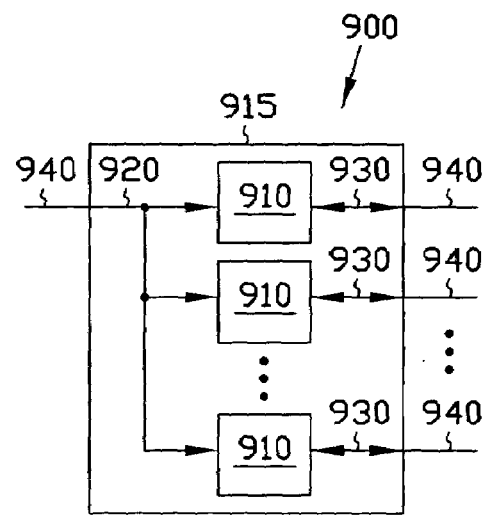
FIG. 17 is a block diagram of an exemplary memory module in accordance with an embodiment of the invention.

FIG. 17 shows one embodiment of a circuit module as memory module 900.

Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 17.

Electronic Systems

Figure 18:
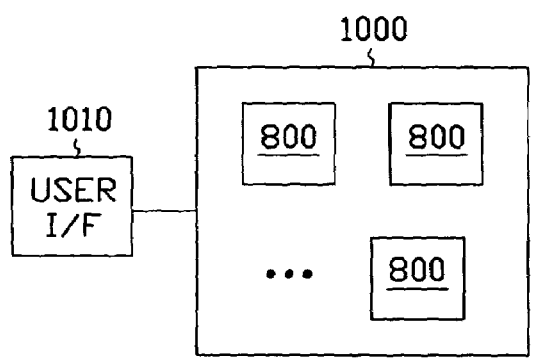
FIG. 18 is a block diagram of an exemplary electronic system in accordance with an embodiment of the invention.

FIG. 18 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 19:
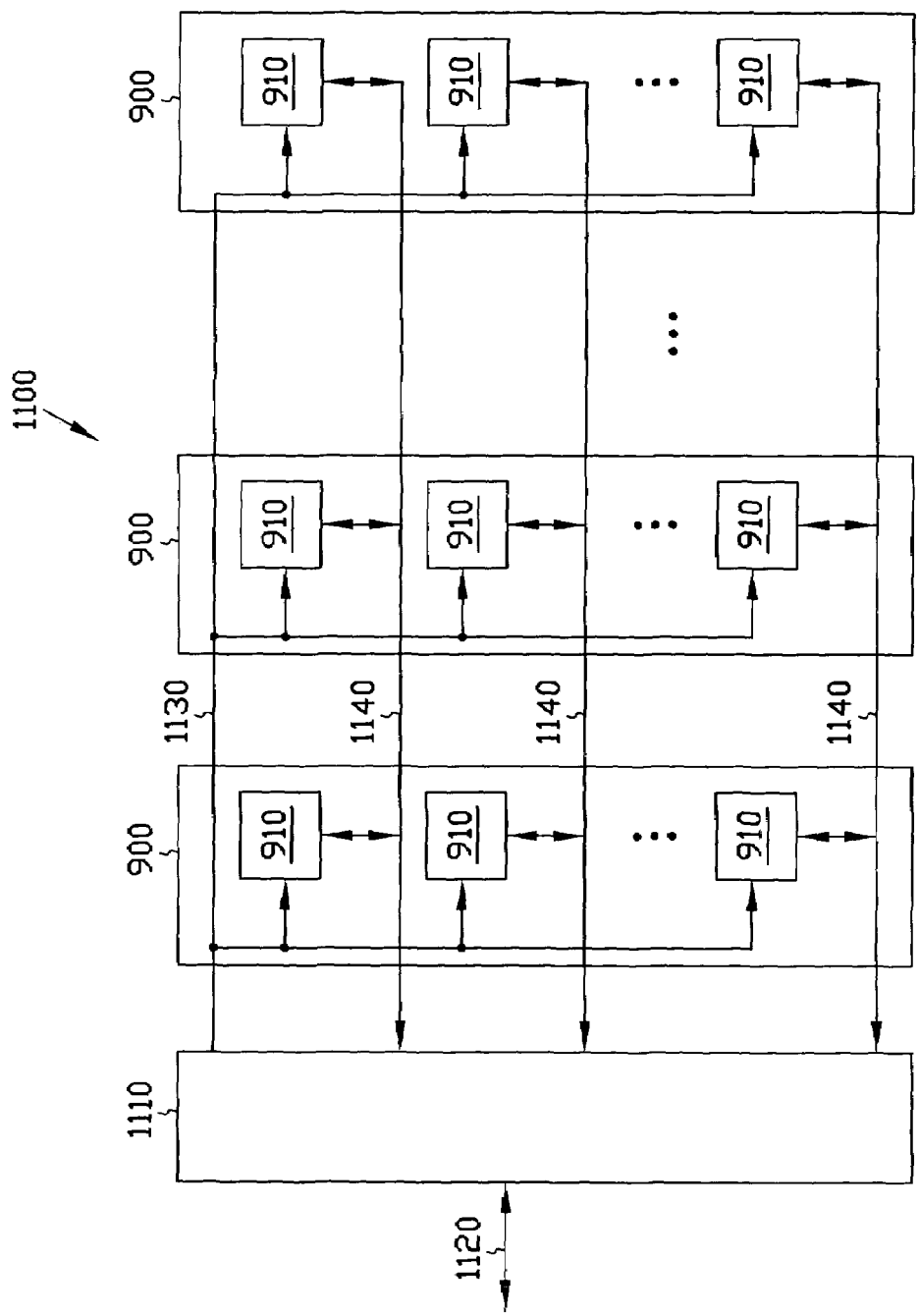
FIG. 19 is a block diagram of an exemplary memory system in accordance with an embodiment of the invention.

FIG. 19 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 20:
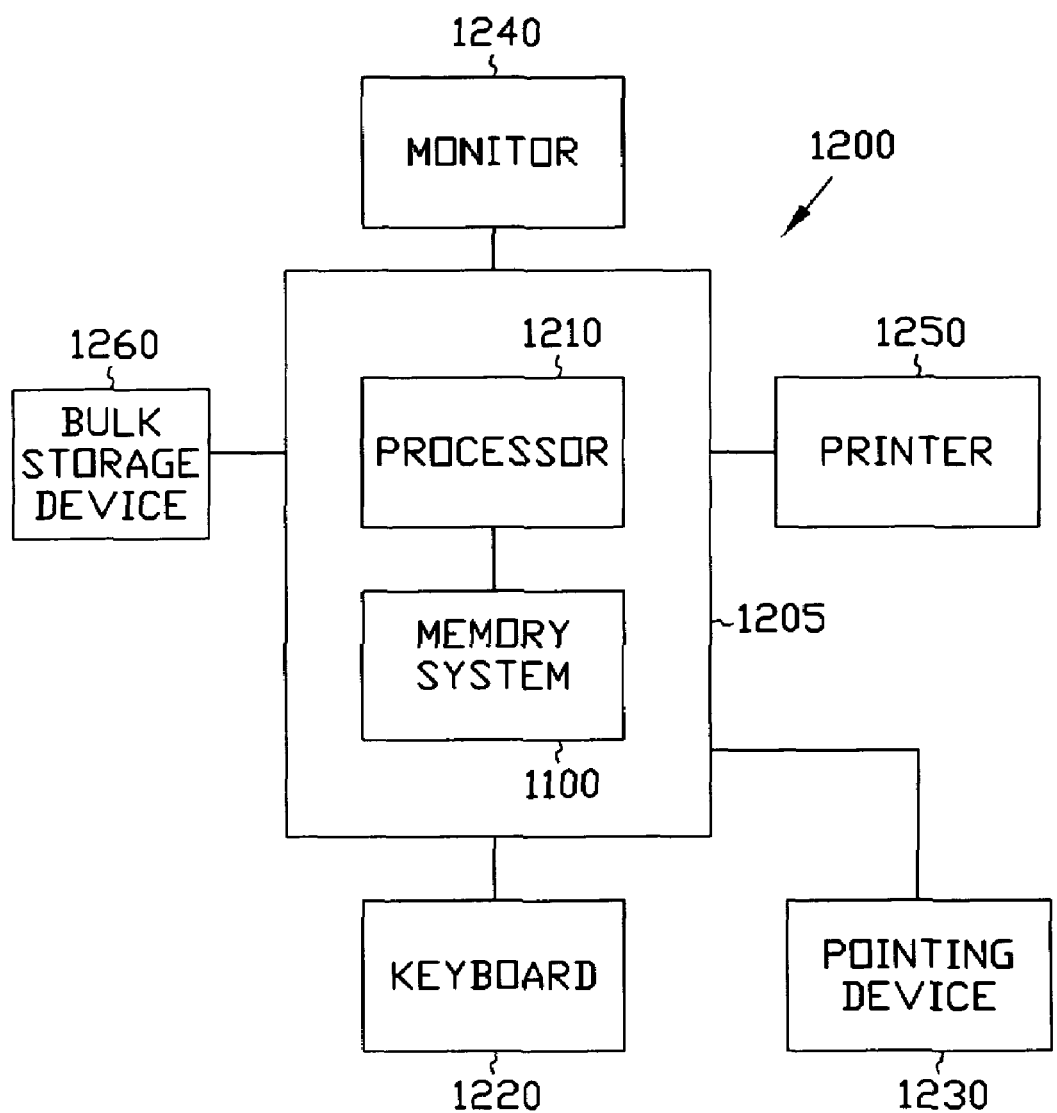
FIG. 20 is a block diagram of an exemplary computer system in accordance with an embodiment of the invention.

FIG. 20 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 13 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

CONCLUSION

Container capacitors are subject to shorting across the tops of the containers forming the bottom plate electrodes. The invention includes container structures and methods of producing such container structures with reduced likelihood of container-to-container shorting. A dielectric cap on the container structure provides an insulative barrier to shorting across the tops of the container structures. Such container capacitors are especially suited for use in memory cells, and various apparatus incorporating such memory cells.

While the invention has been described and illustrated with respect to forming container capacitors for a memory cell, it should be apparent that the same processing techniques can be used to form other container capacitors for other applications as well as other container-shaped structures.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials, shapes and removal processes may be utilized with the invention. Accordingly, this application is intended to cover any adaptations or variations of the invention. It is manifestly intended that this invention be limited only by the following claims and equivalents thereof.

What is claimed is:

1. A semiconductor die, comprising:
an integrated circuit supported by a substrate and having a plurality of integrated circuit devices, wherein at least one of the plurality of integrated circuit devices is a container capacitor, the container capacitor comprising:
a bottom plate having a closed bottom and sidewalls extending upward from the closed bottom, wherein the bottom plate is formed by a method comprising:
forming an insulating layer on the substrate;
forming an opening in the insulating layer, wherein the opening has a bottom on an exposed portion of the substrate and sidewalls defined by the insulating layer;
forming a conductive layer on the insulating layer and the exposed portion of the substrate;
forming a fill layer on the conductive layer, wherein the fill layer fills the opening; and
removing the conductive layer and the fill layer to a level below a top of the insulating layer;
a dielectric cap on a top of the sidewalls, wherein the dielectric cap is formed by a method comprising:
forming a dielectric layer on the insulating layer, the conductive layer and the fill layer; and
removing the dielectric layer from the insulating layer and the fill layer;
a dielectric layer on the bottom plate and the dielectric cap; and
a cell plate on the dielectric layer, wherein the dielectric layer is interposed between the cell plate and the bottom plate.

2. The semiconductor die of claim 1, wherein the bottom plate comprises at least one silicon material selected from the group consisting of amorphous silicon, polysilicon and hemispherical grain polysilicon.

3. The semiconductor die of claim 1, wherein the dielectric cap comprises at least one dielectric material selected from the group consisting of oxides, nitrides and silicon oxynitrides.

4. The semiconductor die of claim 1, wherein the dielectric cap is annealed.

5. The semiconductor die of claim 1, wherein the bottom plate has a cylindrical shape.

6. The semiconductor die of claim 1, wherein the dielectric cap is adapted to form part of the dielectric layer.

7. The semiconductor die of claim 2, wherein the silicon material is conductively doped.

8. The semiconductor die of claim 4, wherein the dielectric cap is annealed at approximately 600° C. to 1000° C. for approximately 10 to 20 seconds.

9. A semiconductor die, comprising:
an integrated circuit supported by a substrate and having a plurality of integrated circuit devices, wherein at least one of the plurality of integrated circuit devices is a container capacitor, the container capacitor comprising:
a bottom plate having a closed bottom and sidewalls extending upward from the closed bottom, wherein the bottom plate is formed by a method comprising:
forming an insulating layer on the substrate;
forming an opening in the insulating layer, wherein the opening has a bottom on an exposed portion of the substrate and sidewalls defined by the insulating layer;
forming a conductive layer on the insulating layer and the exposed portion of the substrate;
forming a fill layer on the conductive layer, wherein the fill layer fills the opening;
removing the fill layer to a level substantially even with a top of the insulating layer; and
removing the conductive layer to a level below the level below the top of the insulating layer;
a dielectric cap on a top of the sidewalls, wherein the dielectric cap is formed by a method comprising:
forming a dielectric layer on the insulating layer, the conductive layer and the fill layer; and
removing the dielectric layer from the insulating layer and the fill layer;
a dielectric layer on the bottom plate and the dielectric cap; and
a cell plate on the dielectric layer, wherein the dielectric layer is interposed between the cell plate and the bottom plate.

10. The semiconductor die of claim 9, wherein the bottom plate comprises at least one silicon material selected from the group consisting of amorphous silicon, polysilicon and hemispherical grain polysilicon.

11. The semiconductor die of claim 9, wherein the dielectric cap comprises at least one dielectric material selected from the group consisting of oxides, nitrides and silicon oxynitrides.

12. The semiconductor die of claim 9, wherein the dielectric cap is annealed.

13. The semiconductor die of claim 9, wherein the bottom plate has a cylindrical shape.

14. The semiconductor die of claim 9, wherein the dielectric cap is adapted to form part of the dielectric layer.

15. The semiconductor die of claim 10, wherein the silicon material is conductively doped.

16. The semiconductor die of claim 12, wherein the dielectric cap is annealed at approximately 600° C. to 1000° C. for approximately 10 to 20 seconds.

* * * * *